United States Patent
Takeda et al.

(10) Patent No.: US 8,305,768 B2
(45) Date of Patent: Nov. 6, 2012

(54) SECONDARY BATTERY PROTECTING MODULE AND LEAD MOUNTING METHOD

(75) Inventors: Itaru Takeda, Akita (JP); Tomoyuki Kato, Akita (JP); Yasuo Shoji, Akita (JP)

(73) Assignee: Mitsumi Electric Co., Ltd., Tama-shi (JP)

(*) Notice: Subject to any disclaimer, the term of this patent is extended or adjusted under 35 U.S.C. 154(b) by 106 days.

(21) Appl. No.: 12/252,258

(22) Filed: Oct. 15, 2008

(65) Prior Publication Data
US 2009/0072008 A1 Mar. 19, 2009

Related U.S. Application Data

(62) Division of application No. 11/322,192, filed on Dec. 29, 2005, now abandoned.

(30) Foreign Application Priority Data

Mar. 28, 2005 (JP) .................................. 2005-90691

(51) Int. Cl.
*H05K 7/00* (2006.01)
(52) U.S. Cl. ....... 361/774; 361/93.1; 361/600; 361/784; 361/785; 320/107; 320/110; 320/134; 439/188; 439/500; 429/7; 429/100; 429/124; 429/127; 429/153; 429/162; 429/175; 174/94 R; 29/843
(58) Field of Classification Search .................. 361/744, 361/774, 93.1, 600, 784, 785; 429/153, 156, 429/160, 161, 175, 176, 7, 100, 124, 127, 429/162; 174/260, 263, 267, 94 R; 320/107, 320/110, 134; 439/188, 500; 29/843
See application file for complete search history.

(56) References Cited

U.S. PATENT DOCUMENTS

| | | | |
|---|---|---|---|
| 4,244,040 A | 1/1981 | Fondiller et al. | |
| 4,857,812 A | 8/1989 | Mochizuki et al. | |
| 4,933,812 A * | 6/1990 | Becker | 361/540 |
| 5,062,567 A * | 11/1991 | Nishihara et al. | 228/105 |
| 5,070,258 A | 12/1991 | Izumi et al. | |
| 5,122,621 A * | 6/1992 | Rohde et al. | 174/539 |
| 5,142,263 A * | 8/1992 | Childers et al. | 338/21 |

(Continued)

FOREIGN PATENT DOCUMENTS

EP 1 403 942 A1 3/2004

(Continued)

OTHER PUBLICATIONS

European Office Action dated Sep. 21, 2010 (in English) in counterpart European Application No. 05113090.4.

(Continued)

*Primary Examiner* — Xiaoliang Chen
(74) *Attorney, Agent, or Firm* — Holtz, Holtz, Goodman & Chick, PC

(57) ABSTRACT

In a lead mounting method of mounting, onto a principal surface of a printed board, a lead to be connected to a terminal, a flat lead is prepared which lead has a mounted part to be disposed on the principal surface of the printed board and a connected part to be connected to the terminal. The flat lead is bent into an L shape so that the mounted part and the connected part are perpendicular to each other to obtain an L-shaped lead. The mounted part of the L-shaped lead is connected and fixed onto the principal surface of the printed board by soldering.

3 Claims, 2 Drawing Sheets

U.S. PATENT DOCUMENTS

| | | | |
|---|---|---|---|
| 5,160,810 A * | 11/1992 | Rohde et al. | 174/50.56 |
| 5,189,387 A * | 2/1993 | Childers et al. | 338/20 |
| 5,383,094 A * | 1/1995 | Estes | 361/773 |
| 5,411,236 A * | 5/1995 | Morita et al. | 248/500 |
| 5,493,266 A * | 2/1996 | Sasaki et al. | 338/22 R |
| 5,497,289 A | 3/1996 | Sugishima et al. | |
| 5,686,698 A * | 11/1997 | Mahadevan et al. | 174/522 |
| 5,831,938 A * | 11/1998 | Sone et al. | 367/140 |
| 5,889,657 A * | 3/1999 | Kono | 361/773 |
| 5,913,551 A * | 6/1999 | Tsutsumi et al. | 29/605 |
| 5,923,529 A * | 7/1999 | Mimachi | 361/679.31 |
| 6,083,045 A * | 7/2000 | Chiu | 439/570 |
| 6,151,221 A | 11/2000 | Van Lerberghe | |
| 6,242,890 B1 | 6/2001 | Sudo et al. | |
| 6,310,534 B1 * | 10/2001 | Brunner | 336/174 |
| 6,396,001 B1 * | 5/2002 | Nakamura | 174/261 |
| 6,431,882 B1 * | 8/2002 | Noda et al. | 439/79 |
| 6,451,474 B1 * | 9/2002 | Kozu et al. | 429/100 |
| 6,461,764 B1 * | 10/2002 | Nakamura | 429/170 |
| 6,507,250 B1 * | 1/2003 | Tada et al. | 333/134 |
| 6,555,960 B1 * | 4/2003 | Kishi et al. | 313/582 |
| 6,556,122 B2 * | 4/2003 | Izaki et al. | 337/405 |
| 6,568,943 B2 * | 5/2003 | Okayasu et al. | 439/76.1 |
| 6,697,259 B1 * | 2/2004 | Nakamura | 361/752 |
| 6,774,310 B1 * | 8/2004 | Dishongh et al. | 174/94 R |
| 6,808,844 B2 * | 10/2004 | Ehara | 429/175 |
| 6,858,993 B2 | 2/2005 | Lee et al. | |
| 6,977,432 B2 * | 12/2005 | Crane et al. | 257/696 |
| 6,994,926 B2 * | 2/2006 | Ikeuchi et al. | 429/7 |
| 7,002,807 B2 * | 2/2006 | Takabatake et al. | 361/752 |
| 7,064,523 B2 | 6/2006 | Aradachi et al. | |
| 7,081,015 B2 * | 7/2006 | Jeon | 439/569 |
| 7,105,248 B2 * | 9/2006 | Yageta et al. | 429/162 |
| 7,392,806 B2 | 7/2008 | Yuen et al. | |
| 7,537,720 B2 * | 5/2009 | Moon | 264/272.21 |
| 7,563,535 B2 * | 7/2009 | Hiratsuka | 429/153 |
| 2002/0014926 A1 * | 2/2002 | Kawanami | 333/24.2 |
| 2002/0074970 A1 | 6/2002 | Kawashima | |
| 2002/0150815 A1 * | 10/2002 | Ehara | 429/90 |
| 2003/0034169 A1 | 2/2003 | Tanaka | |
| 2003/0062601 A1 * | 4/2003 | Harnden et al. | 257/666 |
| 2003/0108780 A1 * | 6/2003 | Iwaizono et al. | 429/7 |
| 2003/0121142 A1 * | 7/2003 | Kikuchi et al. | 29/623.4 |
| 2003/0157399 A1 * | 8/2003 | Ikeuchi et al. | 429/62 |
| 2003/0165736 A1 * | 9/2003 | Hiratsuka | 429/153 |
| 2003/0180582 A1 | 9/2003 | Masumoto et al. | |
| 2003/0227275 A1 * | 12/2003 | Kishi et al. | 320/107 |
| 2004/0135548 A1 | 7/2004 | Takano et al. | |
| 2004/0161664 A1 * | 8/2004 | Hanafusa et al. | 429/162 |
| 2004/0247950 A1 | 12/2004 | Akiho et al. | |
| 2005/0067178 A1 * | 3/2005 | Pearson et al. | 174/52.4 |
| 2005/0093177 A1 * | 5/2005 | Liu | 257/786 |
| 2005/0106454 A1 * | 5/2005 | Kozu et al. | 429/175 |
| 2005/0122667 A1 * | 6/2005 | Moon | 361/600 |
| 2005/0145998 A1 * | 7/2005 | Harnden et al. | 257/666 |
| 2005/0151514 A1 * | 7/2005 | Kozu et al. | 320/147 |
| 2005/0153172 A1 * | 7/2005 | Han | 429/7 |
| 2005/0156574 A1 * | 7/2005 | Sato et al. | 320/134 |
| 2005/0181242 A1 * | 8/2005 | Suzuki et al. | 429/7 |
| 2005/0196668 A1 * | 9/2005 | Nanno et al. | 429/162 |
| 2006/0032667 A1 * | 2/2006 | Sato | 174/260 |

FOREIGN PATENT DOCUMENTS

| | | |
|---|---|---|
| EP | 1 432 053 A1 | 6/2004 |
| JP | 4-75430 A | 3/1992 |
| JP | 2872365 B2 | 1/1999 |
| JP | 11-283589 A | 10/1999 |
| JP | 2000-021372 A | 1/2000 |
| JP | 2000-114680 A | 4/2000 |
| JP | 2001-169477 A | 6/2001 |
| JP | 2001-268808 A | 9/2001 |
| JP | 2003-086159 A | 3/2003 |
| JP | 2003-297315 A | 10/2003 |
| WO | WO 99/02022 A1 | 1/1999 |

OTHER PUBLICATIONS

G. M. Freedman: "Chapter 43 (Solder Materials and Processes)"; C.F. Coombs: "Printed Circuits Handbook"; Aug. 27, 2001; ISBN: 0071350160; p. 43.8.

Japanese Office Action dated Mar. 16, 2011 (and English translation of relevant part thereof) in counterpart Japanese Application No. 2005-090691.

* cited by examiner

SECONDARY BATTERY PROTECTING MODULE AND LEAD MOUNTING METHOD

CROSS-REFERENCE TO RELATED APPLICATIONS

The present application is a Divisional Application of U.S. application Ser. No. 11/322,192 filed Dec. 29, 2005, now abandoned which claims priority to prior Japanese patent application JP 2005-90691, the disclosures of which are incorporated herein by reference.

BACKGROUND OF THE INVENTION

This invention relates to a secondary battery protecting module having a protection circuit for protecting a chargeable battery (secondary battery) such as a lithium ion battery and, in particular, to a method of mounting a lead to be connected to a terminal, such as a terminal of a secondary battery, to a printed board.

Among various secondary batteries, in particular, a lithium ion battery is easily damaged by overdischarge and overcharge. It is therefore essential and indispensable to provide a secondary battery protection circuit for detecting an overdischarged state and an overcharged state of the lithium ion battery as a secondary battery to protect the secondary battery from the overdischarged state and the overcharged state. The secondary battery protection circuit comprises an overdischarge preventing mechanism and an overcharge preventing mechanism. For example, the secondary battery protection circuit is disclosed in Japanese Patent (JP-B) No. 2872365 or Japanese Unexamined Patent Application Publication (JP-A) No. 2001-169477. Typically, an IC chip (protection IC) is used as the secondary battery protection circuit.

The above-mentioned secondary battery protection circuit (protection IC) is disposed on a printed board (circuit board) (for example, see Japanese Unexamined Patent Application Publication (JP-A) No. 2001-268808). On the printed board, a power MOSFET (power IC) serving as a discharge control switch and a charge control switch, and a plurality of electronic components, such as a resistor and a capacitor, are disposed. A combination of the printed board, the secondary battery protection circuit, the power MOSFET, and the electronic components is called a secondary battery protection module.

The secondary battery protection module is electrically connected to terminals of the secondary battery such as the lithium ion battery. A combination of the secondary battery protection module and the secondary battery is called a battery pack.

The secondary battery has an anode terminal and a cathode terminal as the terminals. In order to establish electrical connection with the anode terminal and the cathode terminal of the secondary battery, the secondary battery protection module has a pair of leads on the printed board. For example, each lead comprises a nickel lead. One of the leads which is to be connected to the anode terminal of the secondary battery is called an anode lead. The other lead to be connected to the cathode terminal of the secondary battery is called a cathode lead.

On the other hand, in order to establish electrical connection with a load or a battery charger, the secondary battery protection module has a pair of external connection terminals on the printed board. One of the external connection terminals is a positive terminal. The other external connection terminal is a negative terminal.

Referring to FIG. 1, a related secondary battery protection module 10A will be described. The secondary battery protection module 10A comprises the printed board (circuit board) 11 having a principal surface 11a and a back surface 11b opposite to each other. On the principal surface 11a of the printed board 11, the secondary battery protection circuit (protection IC), the power MOSFET (power IC), the electronic components, and the leads (the anode lead and the cathode lead) 21A (only the anode lead being illustrated in FIG. 1) are disposed. On the other hand, on the back surface 11b of the printed board 11, the external connection terminals (the positive terminal and the negative terminal) and so on are disposed. Between the anode lead 21A and the cathode lead, the secondary battery protection circuit (protection IC) is connected through an internal wiring of the printed board 11. Between the cathode lead and the negative terminal, the power MOSFET (power IC) is connected through another internal wiring of the printed board.

As shown in FIG. 1, each of the leads 21A to be connected to the anode terminal and the cathode terminal of the secondary battery has an L shape. Specifically, the L-shaped lead 21A has a mounted part 21Aa to be mounted (or disposed) on the principal surface 11a of the printed board 11 and a connected part 21Ab to be connected to the terminal (the anode terminal or the cathode terminal) of the secondary battery.

In the secondary battery protection module 10A, the L-shaped lead 21A is mounted on the principal surface 11a of the printed board 11 in the following manner. It is noted here that, on the principal surface 11a of the printed board 11, a land 50 is formed. At first, a flat lead is prepared. The mounted part 21Aa of the flat lead is connected and fixed to the land 50 of the principal surface 11a of the printed board 11 by using a solder 52. Thereafter, the connected part 21Ab of the flat lead is bent by 90° (right angle) with respect to the mounted part 21Aa. Thus, the flat lead is formed into the L-shaped lead 21A.

As described above, in the secondary battery protection module 10A, the lead is mounted on the principal surface 11a of the printed board 11 by connecting and fixing the flat lead to the land 50 of the principal surface 11a of the printed board 11 using the solder 52 and thereafter bending the flat lead by 90° to form the flat lead into the L-shaped lead 21A.

In the above-mentioned lead mounting method, when the flat lead is bent by 90°, a crack may be caused to occur in the solder 52. In order to avoid occurrence of the crack, the flat lead is bent at a position spaced by a predetermined distance from an edge of the land 50 as shown in FIG. 1. Therefore, the mounted part 21Aa has a length Lm' greater than a length Ll of the land 50 in a bending direction.

However, even if the flat lead is bent at the position spaced from the edge of the land 50, the solder 52 is subjected to a force in a direction of separating the solder 52 from the land 50. As a result, it is difficult to completely avoid occurrence of the crack in the solder 52.

SUMMARY OF THE INVENTION

It is therefore an object of this invention to provide a lead mounting method capable of completely avoiding occurrence of a crack in a soldering portion.

It is another object of this invention to provide a secondary battery protection module having a lead mounted by the method.

Lead mounting methods according to this invention and secondary battery protection modules according to this invention are as follows:

(1) A lead mounting method of mounting, onto a principal surface of a printed board, a lead to be connected to a terminal, the method comprising the steps of:

preparing a flat lead which has a mounted part to be disposed on the principal surface of the printed board and a connected part to be connected to the terminal;

bending the flat lead into an L shape so that the mounted part and the connected part are perpendicular to each other to obtain an L-shaped lead; and connecting and fixing the mounted part of the L-shaped lead onto the principal surface of the printed board by soldering.

(2) A lead mounting method as described in section (1), wherein the terminal is a terminal of a secondary battery.

(3) A lead mounting method as described in section (1), wherein the lead is a nickel lead.

(4) A secondary battery protection module comprising:

a printed board having a principal surface and a back surface opposite to each other;

a protection circuit disposed on the principal surface of the printed board for protecting a secondary battery;

switching means disposed on the principal surface of the printed board for turning on and off discharge and charge of the secondary battery under control of the protection circuit; and a pair of L-shaped leads disposed on the principal surface of the printed board to be connected to an anode terminal and a cathode terminal of the secondary battery, wherein:

each of the L-shaped leads is mounted on the principal surface of the printed board by soldering with each of the L-shaped leads preliminarily formed by bending a flat lead into an L shape.

(5) A secondary battery protection module as described in section (4), further comprising a pair of external connection terminals mounted on the rear surface of the printed board.

(6) A secondary battery protection module as described in section (4) or (5), wherein each of the L-shaped leads has a mounted part to be mounted on the printed board, the mounted part having a length in a bending direction not greater than a length of a land formed on the printed board.

In this invention, the flat lead is preliminarily formed into an L shape and thereafter mounted onto the principal surface of the printed board by soldering. It is therefore possible to completely avoid occurrence of a crack in a soldering portion.

DESCRIPTION OF THE PREFERRED EMBODIMENT

Figure 1:
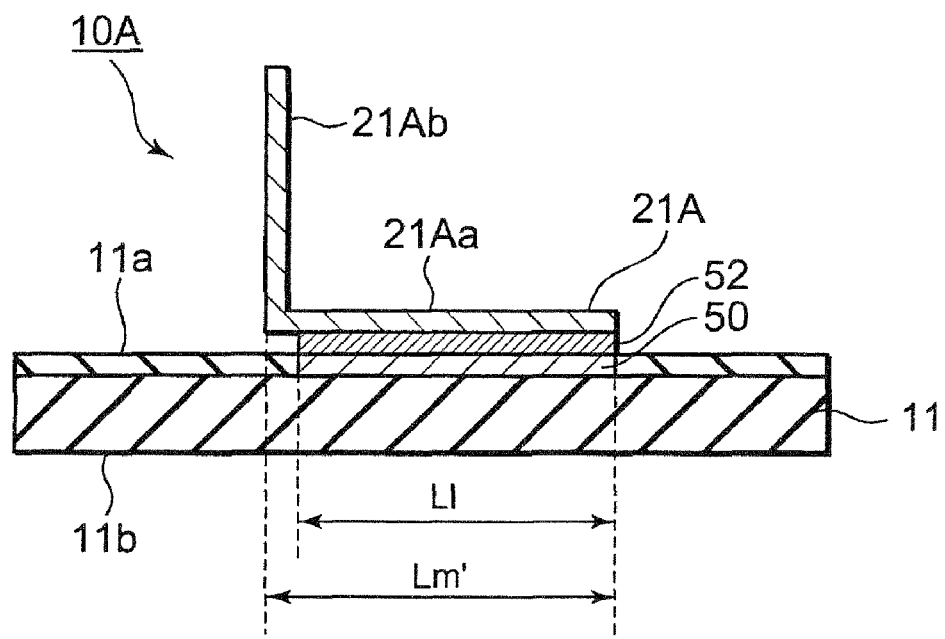
FIG. 1 is a sectional view of a related secondary battery protection module.

Now, an embodiment of this invention will be described in detail with reference to the drawing.

Referring to FIGS. 2A to 2D, description will be made of a secondary battery protection module 10 to which a lead mounting method according to the embodiment of this invention is applicable.

As will later be described, the secondary battery protection module 10 is electrically connected to a secondary battery (not shown) such as a lithium ion battery. The secondary battery has an anode terminal and a cathode terminal. A combination of the secondary battery protection module 10 and the secondary battery is called a battery pack.

The secondary battery protection module 10 comprises a printed board 11. The printed board 11 has a principal surface 11a and a back surface 11b opposite to each other. The printed board 11 illustrated in the figure has a thickness of about 0.7 mm.

On the principal surface 11a of the printed board 11, a secondary battery protection circuit (protection IC) 12, a power MOSFET (power IC) 13 serving as a discharge control switch and a charge control switch, a plurality of electronic components 14 such as a resistor and a capacitor are disposed.

The secondary battery protection circuit 12 is a circuit for detecting an overdischarged state and an overcharged state of the secondary battery to protect the secondary battery from the overdischarged state and the overcharged state. The power MOSFET 13 serves as a switching member for turning on and off discharge and charge of the secondary battery under control of the secondary battery protection circuit 12.

In order to establish electrical connection with the anode terminal and the cathode terminal of the secondary battery, the secondary battery protection module 10 has a pair of leads 21 and 22 on the principal surface 11a of the printed board 11. For example, each of the leads 21 and 22 comprises a nickel lead containing 99% of a nickel component. One lead 21 to be connected to the anode terminal of the secondary battery is called an anode lead while the other lead 22 to be connected to the cathode terminal of the secondary battery is called a cathode lead.

Figure 2A:
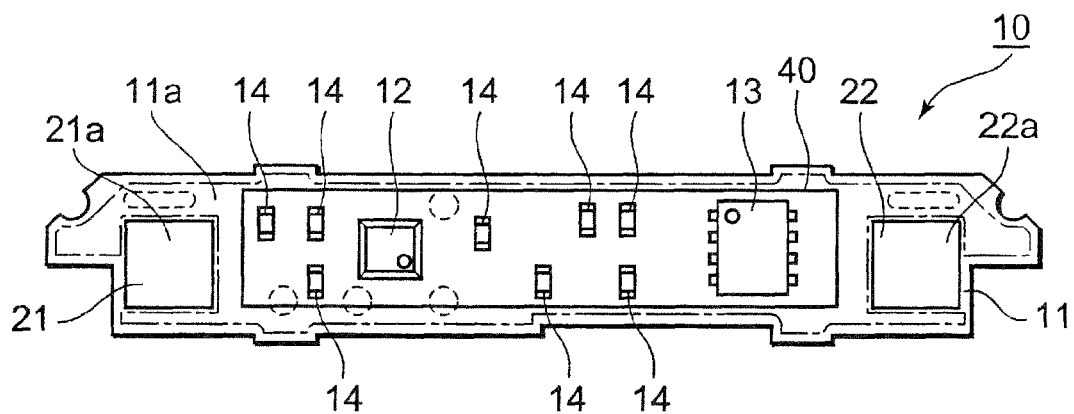
FIGS. 2A to 2D show a secondary battery protection module to which a lead mounting method according to an embodiment of this invention is applicable FIG. 2A being a plan view, FIG. 2B being a rear view, FIG. 2C being a front view, FIG. 2D being a side view.
Figure 2B:
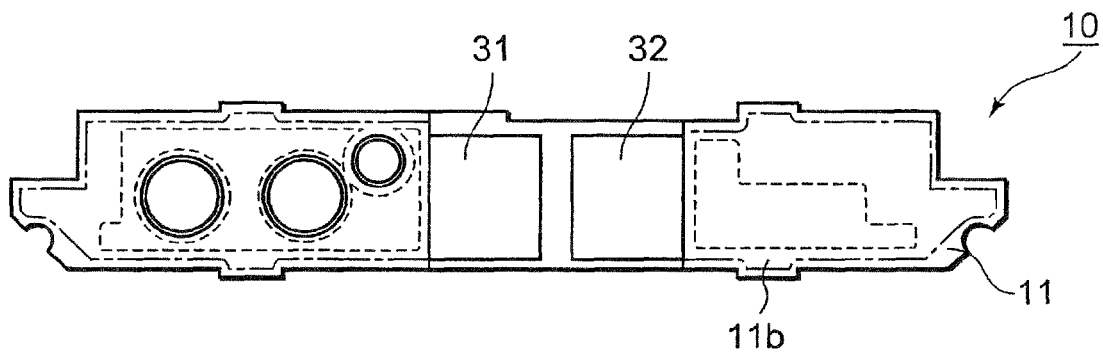
Figure 2C:
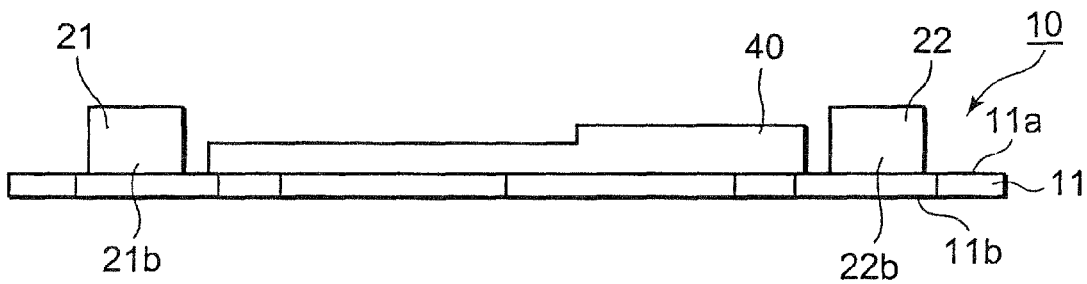

On the other hand, as illustrated in FIG. 2B, in order to establish electrical connection with a lead or a battery charger, the secondary battery protection module 10 has a pair of external connection terminals 31 and 32 on the back surface 11b of the printed board 11. One of the external connection terminals is a positive terminal 31 and the other is a negative terminal 32. Each of the positive terminal 31 and the negative terminal 32 is plated with gold and has a thickness greater than 0.5 μm.

Between the anode lead 21 and the cathode lead 22, the secondary battery protection circuit (protection IC) 12 is connected through an internal wiring (not shown) of the printed board 11. Between the cathode lead 22 and the negative terminal 32, the power MOSFET (power IC) 13 is connected through another internal wiring (not shown) of the printed board 11.

Figure 2D:
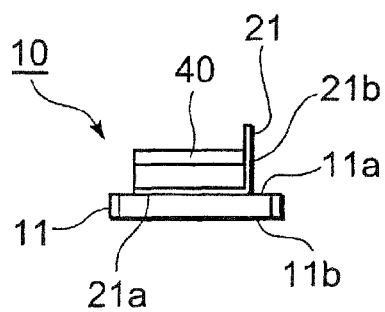

As illustrated in FIG. 2D, each of the leads 21 and 22 to be connected to the anode terminal and the cathode terminal of the secondary battery has an L shape. Specifically, the L-shaped lead 21 has a mounted part 21a to be mounted (disposed) on the principal surface 11a of the printed board 11 and a connected part 21b to be connected to the anode terminal of the secondary battery. Likewise, the L-shaped lead 22 has a mounted part 22a to be mounted (disposed) on the principal surface 11a of the printed board 11 and a connected part 22b to be connected to the cathode terminal of the secondary battery.

Those circuit components mounted on the principal surface 11a of the printed board 11, i.e., the secondary battery protection circuit 12, the power MOSFET 13, and the electronic components 14 are encapsulated by a resin 40.

Figure 3:
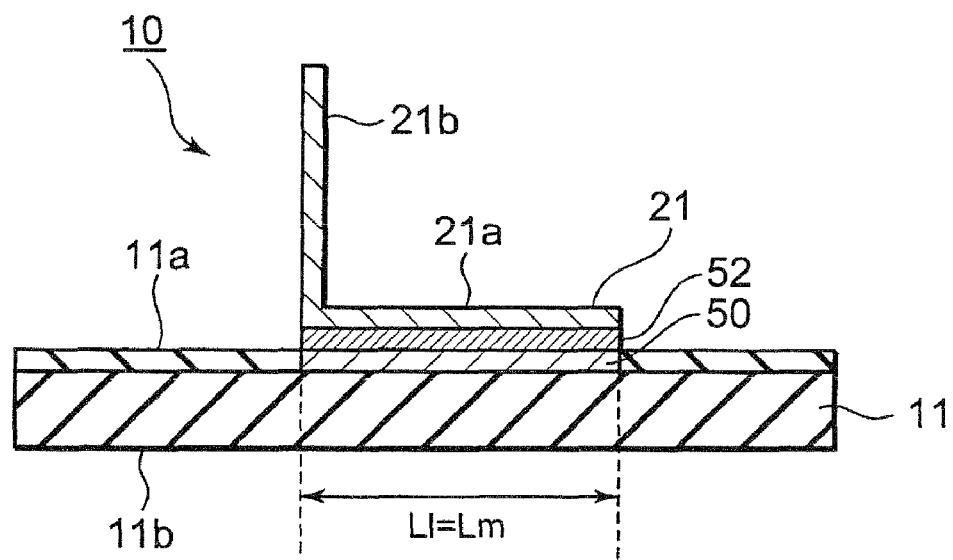
FIG. 3 is a sectional view of the secondary battery protection module illustrated in FIGS. 2A to 2D.

Next referring to FIG. 3 in addition to FIGS. 2A to 2D, description will be made of a lead mounting method of mounting the L-shaped leads 21 and 22 onto the principal surface 11a of the printed board 11 according to the embodiment. On the principal surface 11a of the printed board 11, a land 50 is formed. In FIG. 3, the anode lead 21 alone is shown in an enlarged scale. As will readily be understood, the cathode lead 22 is similar in structure.

At first, two flat leads are prepared. Next, the two flat leads are bent into an L shape so that the mounted parts 21a and 22a to be disposed on the principal surface 11a of the printed board 11 are perpendicular to the connected parts 21b and 22b to be connected to the terminals (the anode terminal and the cathode terminal) of the secondary battery. Thus, the L-shaped leads 21 and 22 are obtained. The mounted parts 21a and 22a of the L-shaped leads 21 and 22 are connected and fixed onto the land 50 of the principal surface 11a of the printed board 11 by using a solder 52. Thus, the L-shaped leads 21 and 22 are mounted on the principal surface 11a of the printed board 11.

As described above, in the lead mounting method according to the embodiment of this invention, the flat lead is preliminarily formed into the L shape and thereafter mounted onto the principal surface 11a of the printed board 11. Therefore, as compared with the above-mentioned lead mounting method in which the flat lead is bent by 90° after soldering using the solder 50, it is possible to completely avoid occurrence of a crack in a soldering portion by the solder 50.

As illustrated in FIG. 3, the mounted part 21a has a length Lm substantially equal to a length Ll of the land 50 in a bending direction.

While this invention has thus far been described in connection with the preferred embodiment, it will readily be understood that this invention is not limited to the foregoing embodiment. In FIG. 3, the length Ll of the land 50 is equal to the length Lm of the mounted part 21a. Alternatively, in order to more firmly attach the lead, the length Lm of the mounted part 21a may be slightly shorter than the length Ll of the land 50 so as to form a fillet.

In the foregoing embodiment, the nickel lead is used as the lead. However, the material of the lead is not limited to nickel. Further, in the foregoing embodiment, description has been directed to the lead mounting method in which the lead is electrically connected to the terminal (the anode terminal or the cathode terminal) of the secondary battery. However, the terminal is not limited to the terminal of the secondary battery.

What is claimed is:

1. A lead mounting method of mounting, onto a mounting surface of a printed board, a pair of L-shaped leads to be connected to an anode terminal and a cathode terminal of a secondary battery, respectively, said method comprising:
   preparing two flat leads, each of which has a mounted part having an outer lower surface to be disposed on the mounting surface of the printed board and a connected part to be connected to one of the anode terminal and the cathode terminal;
   bending each of the two flat leads into an L shape so that the mounted part and the connected part of each of the two leads are perpendicular to each other to obtain the L-shaped leads; and
   connecting and fixing all of the outer lower surface of the mounted part of each of the L-shaped leads onto the mounting surface of the printed board by soldering;
   wherein after bending each of the two flat leads into the L shape to obtain the L-shaped leads and before connecting the connected part of each of the L-shaped leads to one of the anode terminal and the cathode terminal of the secondary battery, all of the outer lower surface of the mounted part of each of the L-shaped leads is connected and fixed onto the mounting surface of the printed board by the soldering; and
   wherein the connecting and fixing comprises connecting and fixing all of the outer lower surface of the mounted part of each of the L-shaped leads to a land formed on the mounting surface of the printed board by the soldering, so that all of the outer lower surface of the mounted part of each of the L-shaped leads has a length in a bending direction that is not greater than a length of the land.

2. A lead mounting method as claimed in claim 1, wherein each of the L-shaped leads is a nickel lead.

3. A lead mounting method as claimed in claim 1, wherein said connecting and fixing comprises connecting and fixing all of the outer lower surface of the mounted part of each of the L-shaped leads to the land formed on the mounting surface of the printed board by the soldering, so that the length in the bending direction of all of the outer lower surface of the mounted part of each of the L-shaped leads is shorter than the length of the land and an edge of the mounted part of each of the L-shaped leads is positioned inside an edge of the land, and so as to form a fillet of the soldering in order to firmly attach each of the L-shaped leads to the land.

* * * * *